United States Patent
Malone et al.

(10) Patent No.: US 6,922,337 B2
(45) Date of Patent: Jul. 26, 2005

(54) CIRCUIT CARD DIVIDER TO FACILITATE THERMAL MANAGEMENT IN AN ELECTRONIC SYSTEM

(75) Inventors: Christopher G. Malone, Rocklin, CA (US); Ken Robertson, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 160 days.

(21) Appl. No.: 10/427,226

(22) Filed: Apr. 30, 2003

(65) Prior Publication Data

US 2004/0218359 A1 Nov. 4, 2004

(51) Int. Cl.[7] .............................................. H05K 7/20
(52) U.S. Cl. ...................... 361/695; 361/692; 361/694; 361/721; 361/752
(58) Field of Search ................................. 361/687–690, 361/694, 695, 721, 724, 727, 752; 174/16.1, 252; 165/104.33, 122; 454/184

(56) References Cited

U.S. PATENT DOCUMENTS

| | | | |
|---|---|---|---|
| 5,210,680 A | * | 5/1993 | Scheibler .................... 361/695 |
| 5,471,099 A | * | 11/1995 | Larabell et al. ................ 307/53 |
| 6,058,011 A | | 5/2000 | Hardt et al. |
| 6,118,667 A | * | 9/2000 | Grosser et al. ............. 361/752 |
| 6,122,176 A | * | 9/2000 | Clements ..................... 361/752 |
| 6,128,187 A | | 10/2000 | Mimlitch, III et al. |
| 6,230,541 B1 | | 5/2001 | Mimlitch, III et al. |
| 6,330,168 B1 | | 12/2001 | Pedoeem et al. |
| 6,356,444 B1 | | 3/2002 | Pedoeem |
| 6,359,565 B1 | | 3/2002 | Pedoeem et al. |
| 6,437,979 B1 | | 8/2002 | Unrein |
| 6,442,035 B1 | * | 8/2002 | Perry et al. .................. 361/756 |
| 6,538,885 B1 | | 3/2003 | Azar |
| 6,580,616 B2 | * | 6/2003 | Greenside et al. .......... 361/752 |
| 6,744,633 B1 | * | 6/2004 | Dials et al. .................. 361/752 |
| 2003/0107878 A1 | | 6/2003 | Kaminski |

FOREIGN PATENT DOCUMENTS

GB            2381128 A         4/2003

* cited by examiner

Primary Examiner—Boris Chervinsky

(57) ABSTRACT

A divider for separating integrated circuit cards in a card cage comprises a planar member, at least one engagement edge disposed on the planar member and capable of engaging a slot in the card cage, and at least one aperture formed in and extending fully through the planar member. The at least one aperture facilitates airflow through the card cage.

20 Claims, 9 Drawing Sheets

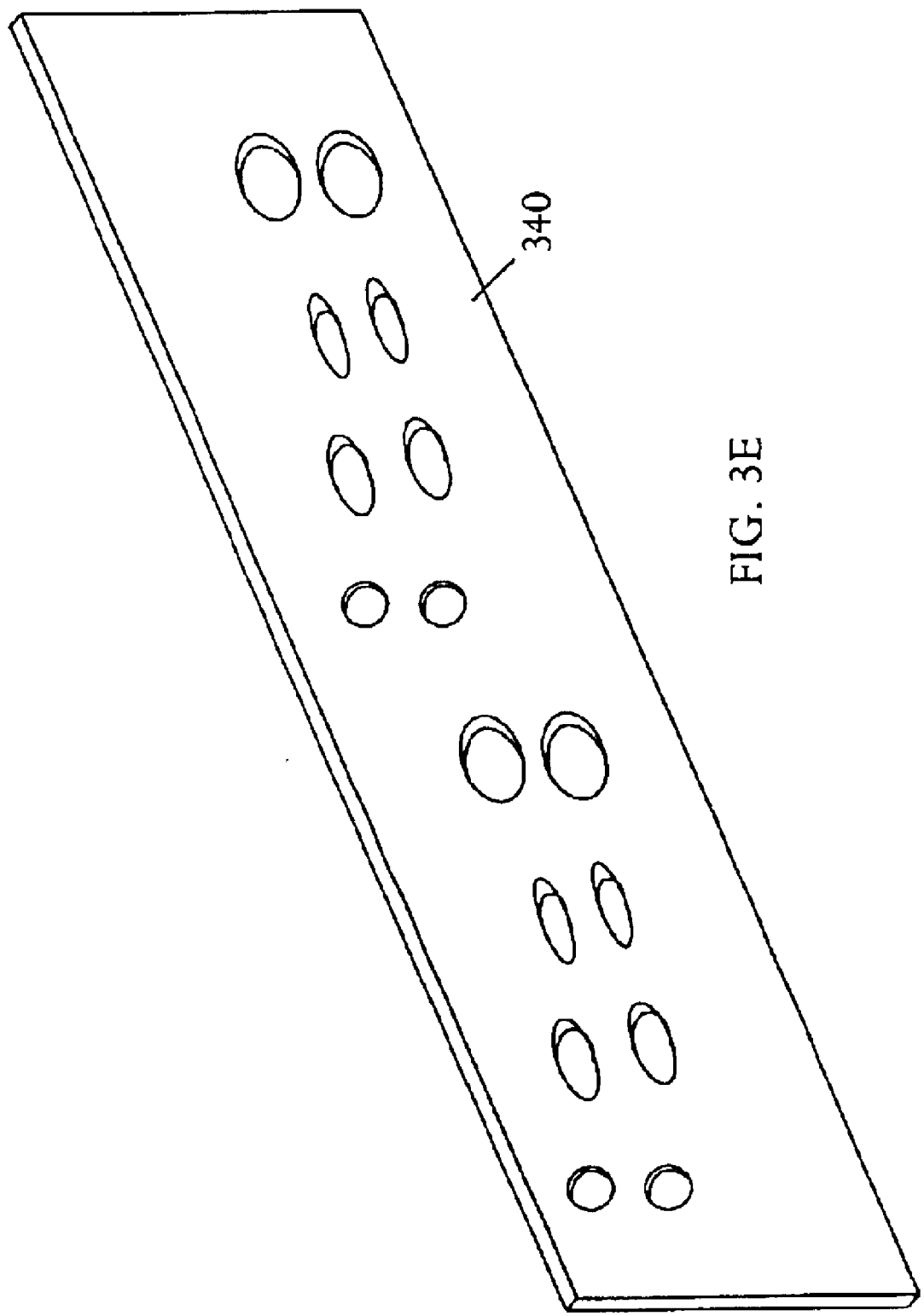

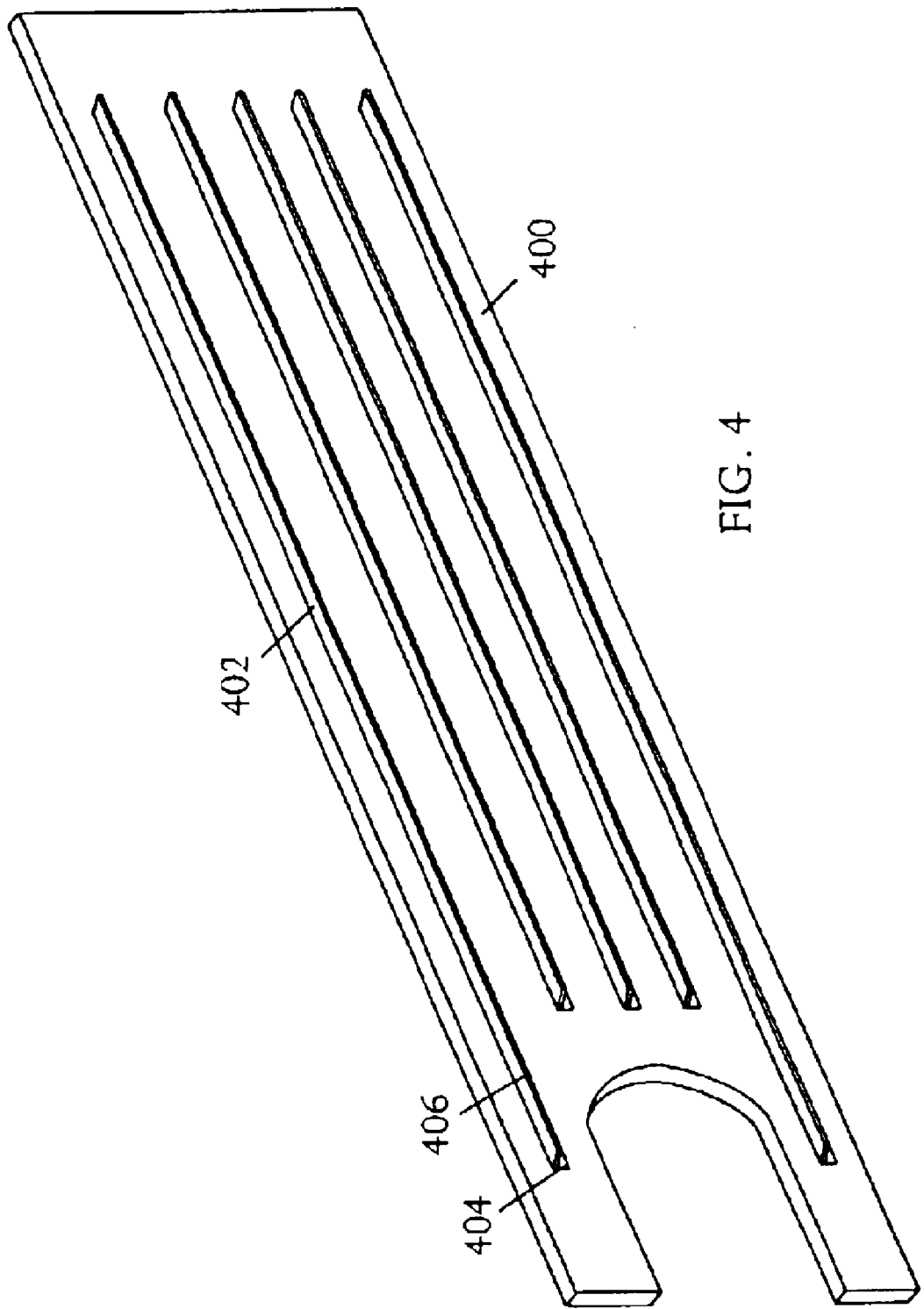

CIRCUIT CARD DIVIDER TO FACILITATE THERMAL MANAGEMENT IN AN ELECTRONIC SYSTEM

BACKGROUND OF THE INVENTION

Computer systems, servers, workstations, and other communication, computational, and control devices housed in cabinets, closets, and various other enclosures have developed into highly complex and highly populated electronic systems. As the complexity of these systems has increased, power and heat dissipation requirements have become more burdensome. Typical techniques for dissipating heat include usage of fans, ducting, and/or passive heat sinks.

An appropriately designed system supplies adequate cooling to maintain component die temperatures within thermal specifications. Various cooling techniques involve supply of a low local-ambient temperature, assuring an adequate airflow, and reducing die to local-ambient thermal resistance. When component die temperature is kept within suitable limits, chipset reliability, performance, and functionality can be maintained. Operation at temperatures outside the specifications can degrade system performance and may permanently change component operating characteristics.

Simple and effective system cooling is generally sought through careful design and placement of fans, vents, and ducts. If additional cooling is required, thermal design techniques may be supplemented by usage of component thermal devices. Fan and heat sink sizes can be selected to accommodate considerations including size, space, and acoustic noise constraints. In one example, a heat sink can be attached to a heat-generating component, such as a processor, using a strap clip. In another example, a reference beat sink can be attached to a component via thermal adhesive tape.

Computing, communication, control, and other systems that have a hot-plug or hot-swap capability create additional difficulties in maintaining a sufficiently cool internal temperature. For example, a system that includes one or more Peripheral Component Interconnect (PCI) buses generally supports hot-plug and hot-swap capabilities that allow removal and installation of PCI cards while the system remains running. Hot-pluggable components may include disk drives, PCI cards, fan trays, power supplies, and other components. One difficulty with hot-pluggable and hot-swappable components is that circuits and interconnects on different cards or boards may collide or touch during physical manipulation, possibly resulting in short-circuiting, physical damage, and/or electrical damage. To avoid touching or collisions between boards or cards during manipulation, a system generally may include one or more dividers that separate the cards, boards, or components and prevent physical contact and resulting damage. Unfortunately, the dividers obstruct air flow within a system, thereby interfering with cooling. The problem is accentuated by the market preference for smaller, more compact systems with more compact card configurations and fans arranged in close proximity to the cards.

SUMMARY OF THE INVENTION

What is desired is a card divider and system arrangement that facilitates cooling of components in a computing, communication, control, or other electronic system.

According to some embodiments, a divider for separating integrated circuit cards in a card cage comprises a planar member, at least one engagement edge disposed on the planar member and capable of engaging a slot in the card cage, and at least one aperture formed in and extending fully through the planar member. The at least one aperture facilitates airflow through the card cage.

In accordance with other embodiments, an electronic system comprises an enclosure, a card cage enclosed within the enclosure and having a plurality of slots capable of securing a corresponding plurality of circuit cards, a cooling fan, and at least one divider. The cooling fan is coupled inside the enclosure adjacent the card cage and directs airflow toward the card cage to regulate temperature of the circuit cards. The dividers separate the circuit cards in the card cage and further comprise a planar member, at least one engagement edge disposed on the planar member and capable of engaging a slot in the card cage, and at least one aperture formed in and extending fully through the planar member. The at least one aperture facilitates airflow through the card cage.

In accordance with further embodiments, an apparatus for separating integrated circuit cards in a card cage comprises means for electrically and physically separating two integrated circuit cards, means disposed on the separating means for engaging a slot in the card cage, and means formed in and extending fully through the separating means for facilitating airflow through the card cage.

BRIEF DESCRIPTION OF THE DRAWINGS

Embodiments of the invention relating to both structure and method of operation, may best be understood by referring to the following description and accompanying drawings.

FIG. 3A through 3F, multiple schematic pictorial diagrams illustrate examples of various aperture designs in card dividers to create or facilitate effective cooling.

FIG. 4 is a schematic pictorial diagram depicting an example of a divider that includes a plurality of louvers to manage airflow.

DETAILED DESCRIPTION

Figure 1:
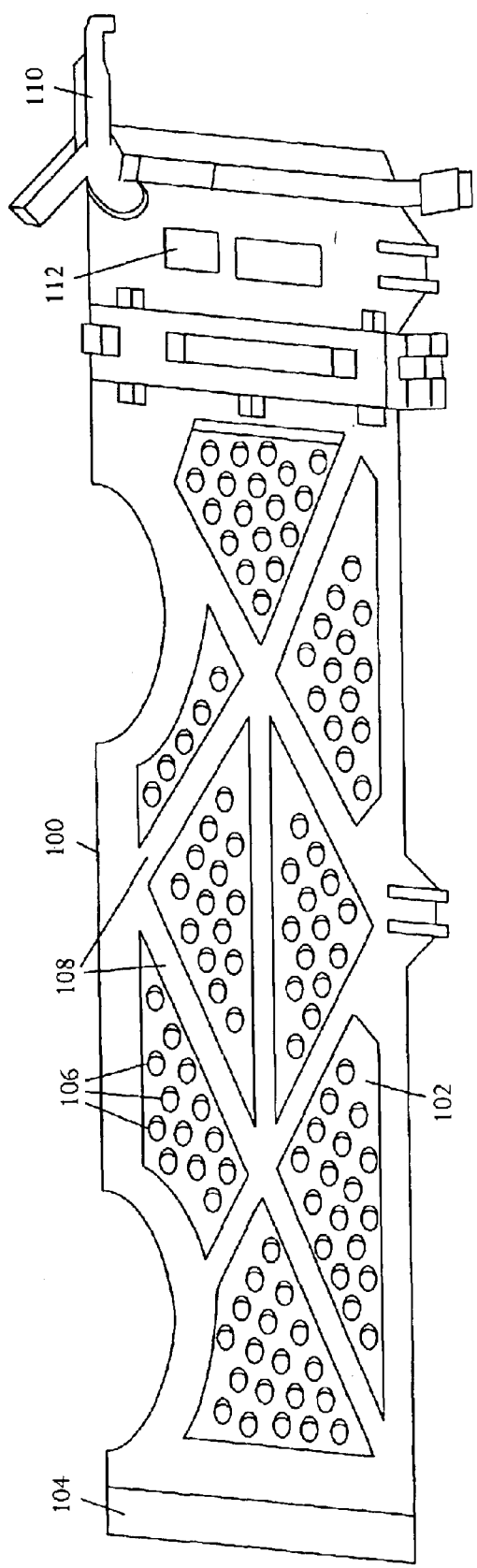
FIG. 1 is a schematic pictorial diagram illustrating an embodiment of a divider for separating integrated circuit cards in a card cage.

Referring to FIG. 1, a schematic pictorial diagram illustrates an embodiment of a divider 100 for separating integrated circuit cards in a card cage. The divider 100 comprises a planar member 102, at least one engagement edge 104 coupled to or formed on the planar member 102, and a plurality of apertures or holes 106 formed in and extending fully through the planar member 102. In the illustrative embodiment, the planar member 102 is typically used to separate hot-swap or hot-plug elements or components such as Peripheral Component Interconnect (PCI) devices. Hot-pluggable components generally are PCI cards, disk drives, fan trays, power supplies, and the like. The divider 100 may otherwise be used in systems with hot-pluggable components compliant with standards other than PCI standards or may be used in systems that do not include hot-pluggable or hot-swappable components. Generally, dividers are used in hot-pluggable systems to protect against damage resulting from the insertion and removal of cards during powered operation, although the dividers may also be utilized and used in other circumstances.

The illustrative divider 100 can be a solid sheet of plastic that extends the full length of a card cage such as an input/output card cage. In various embodiments, the divider 100 can extend the length of the card cage, extend longer than a maximum card length, or extend to a distance shorter than a nominal card length. For example, a divider may extend longer than the maximum length of a PCI card and attach to a fan tray. In this manner, a divider longer than the maximum card length may be useful by creating a manifold without using an additional sheet metal piece to constrain the divider card edge. In other embodiments, materials other than plastic can be used for the divider 100 such as composite materials, fiberboard, paper products, or any suitable material. Generally, the divider 100 is constructed of an insulating material that supplies some insulating protection against electrical contact between circuit boards, although in some circumstances electrically-conductive materials may be used.

The engagement edge 104 is capable of guiding and engaging the divider 100 into a slot in the card cage.

The plurality of apertures 106 extend fully through the planar member 102 to enable and facilitate airflow through the divider 100 and supply cooling throughout the card cage. The illustrative divider 100 includes vanes or panels 108 to supply strength or structural support, and a handle 110 for grasping the divider 100 and securing the divider 100 in the card cage. In some embodiments, the divider 100 can include integrated circuit chips 112 to supply desired functionality. For example, some dividers 100 may include integrated circuits capable of sensing conditions such as temperature and circuits and display elements such as light-emitting diodes (LEDs) to notify of particular conditions.

Figure 2:
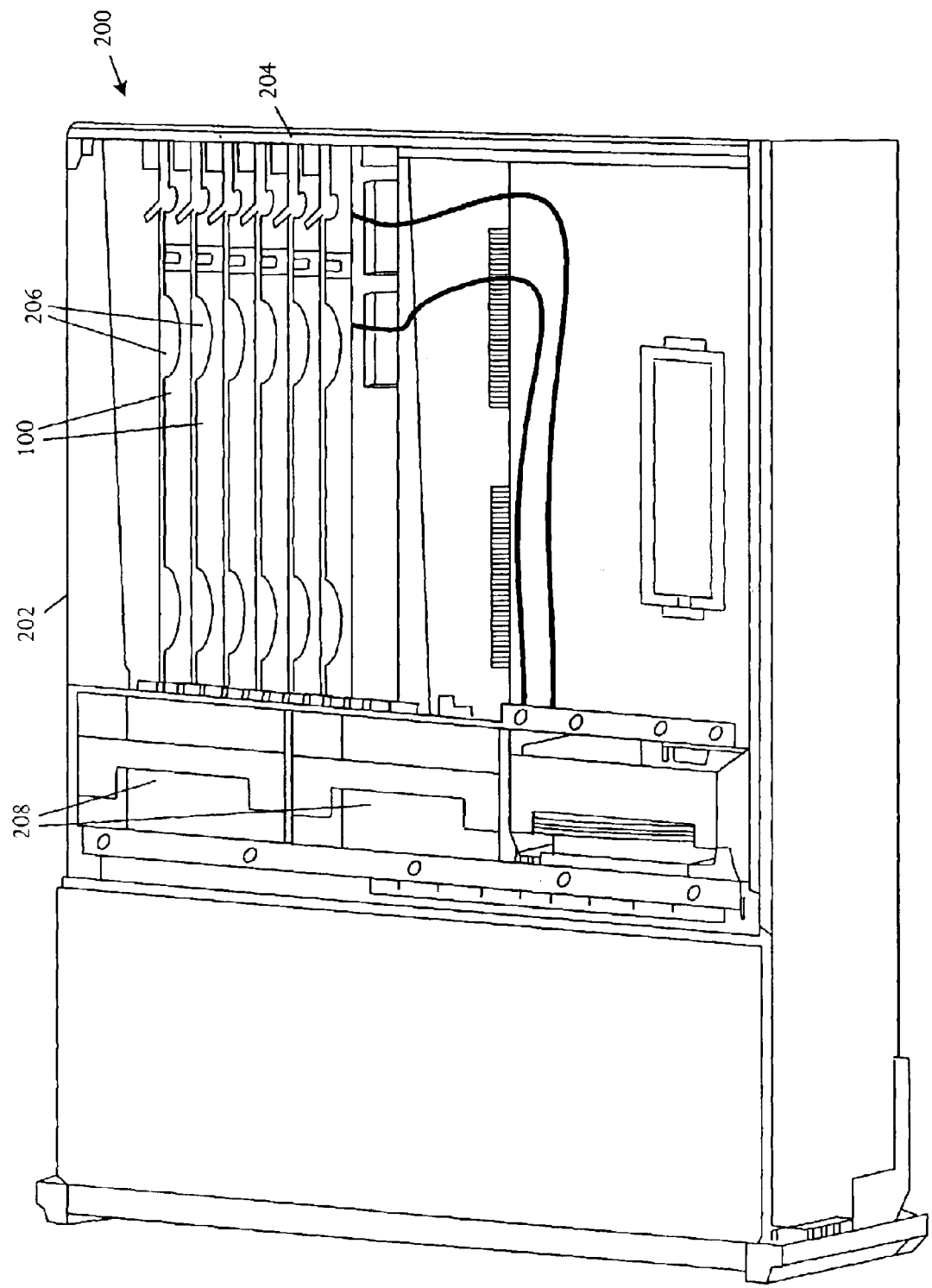
FIG. 2 is a schematic pictorial diagram showing an example of an electronic system that utilizes the divider depicted in FIG. 1 to facilitate cooling while protecting components within the system against physical and electrical damage.

Referring to FIG. 2, a schematic pictorial diagram shows an example of an electronic system 200 comprising an enclosure 202, a card cage 204 enclosed within the enclosure and having a plurality of slots capable of securing a corresponding plurality of circuit cards 206. The illustrative electronic system 200 has a plurality of cooling fans 208. In very dense electronics systems 200 such as servers, the cooling fans 208 are arranged in close proximity to the card cage 204, such as an input/output card cage, potentially obstructing airflow within the system. The cooling fans 208 are connected inside the enclosure 202 adjacent to the card cage 204 and direct airflow toward the card cage 204 to regulate temperature of the circuit cards 206. Dividers 100 are used to separate the circuit cards 206 in the card cage 204. The dividers 100 generally have an edge or guide that functions as an engagement edge for engaging or mating with a slot in the card cage 204.

The dividers 100 have apertures, perforations, cut-outs, holes, or other openings that extend fully through the divider and enable airflow from one side of the divider to the other side. A perforated divider enables air exiting the fans to mix prior to entering the card array, in turn enabling a more balanced flow across all cards. In some embodiments, the improved flow balance can be attained without using an additional sheet metal element in the chassis for mounting the card divider. Usage of dividers without the airflow apertures in a system with fans tightly positioned against the card cage, slot faces aligned with the fan hubs, and little spacing between circuit cards and dividers restricts airflow to each slot. The lack of a manifold between the cooling fans and circuit cards in a system without divider apertures results in high airflow in some channels and restricted airflow in others. Airflow across the card cage is restricted, reducing the amount of cooling air to particular locations the enclosure and possibly resulting in overheating problems.

The illustrative system includes dividers 100 with apertures, perforations, cut-outs, holes, or other openings that enable airflow between cards, balancing air flow and facilitate cooling. The apertures can be designed in various sizes, shapes, and configurations to improve airflow within the enclosure 202.

Figure 3A:
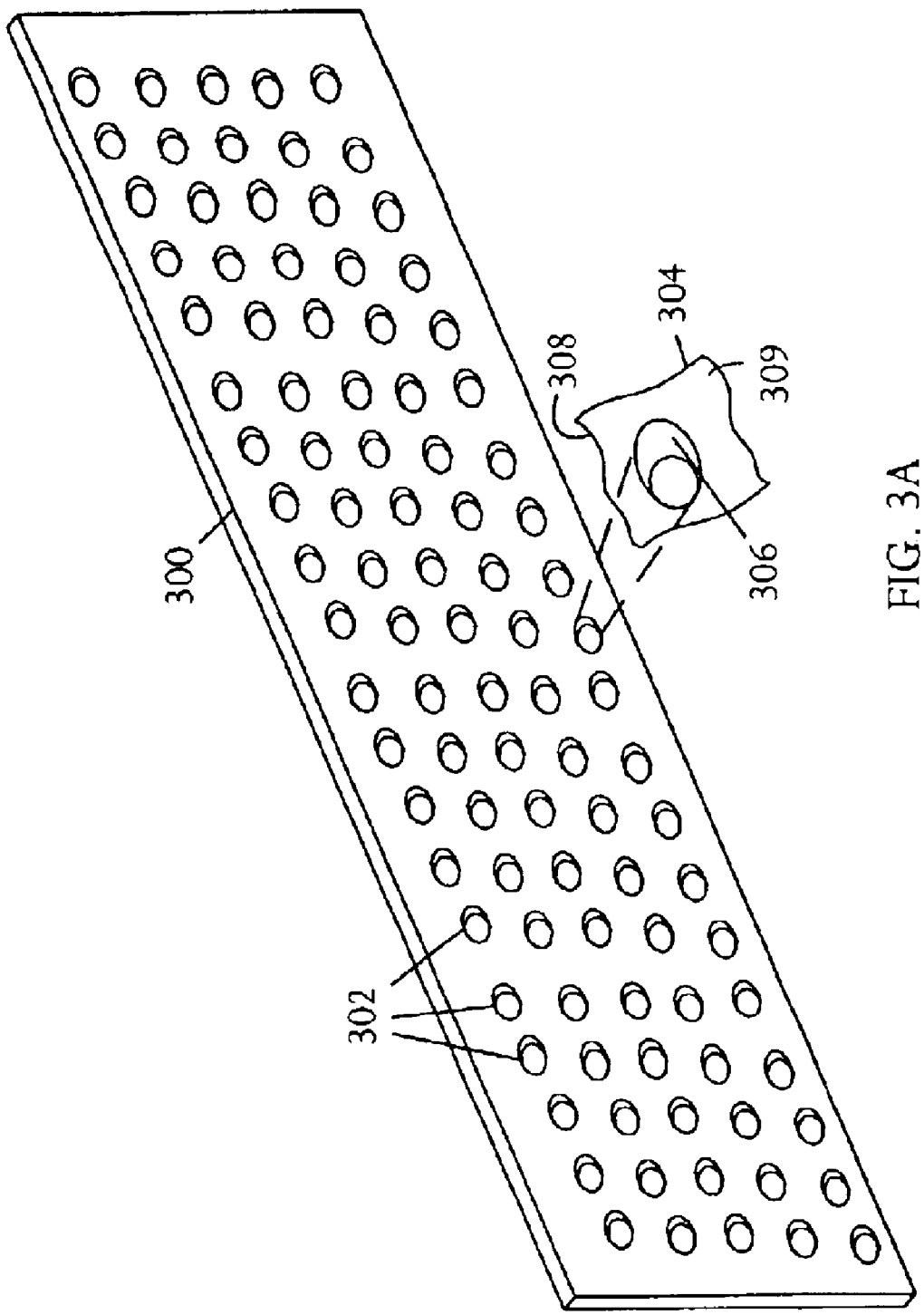

Referring to FIG. 3A through 3F, multiple schematic pictorial diagrams illustrate examples of various aperture designs in card dividers to create or facilitate effective cooling. FIG. 3A shows a divider 300 with a large number of closely-spaced uniform-size apertures 302. A magnified view 304 of an aperture 302 shows an edge 306 with an aerodynamic curved surface that facilitates airflow from a first side 308 to a second side 309 of the divider 300. For example, the opening on the first side 308 is shown to be smaller than the opening on the second side 309 so that the internal surface of the aperture 302 is inclined at an angle to channel airflow through the aperture 302.

Figure 3B:
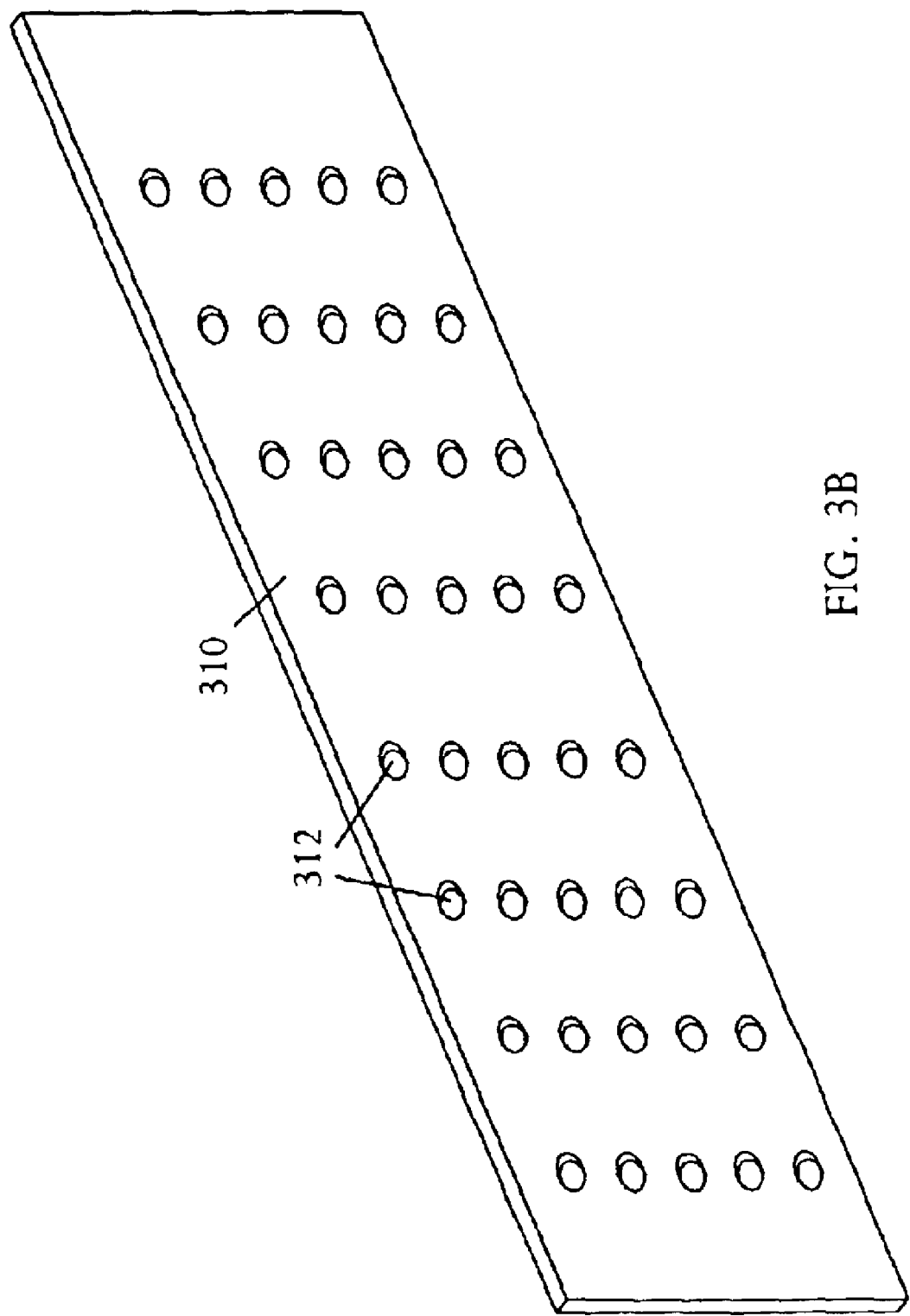
Figure 3C:
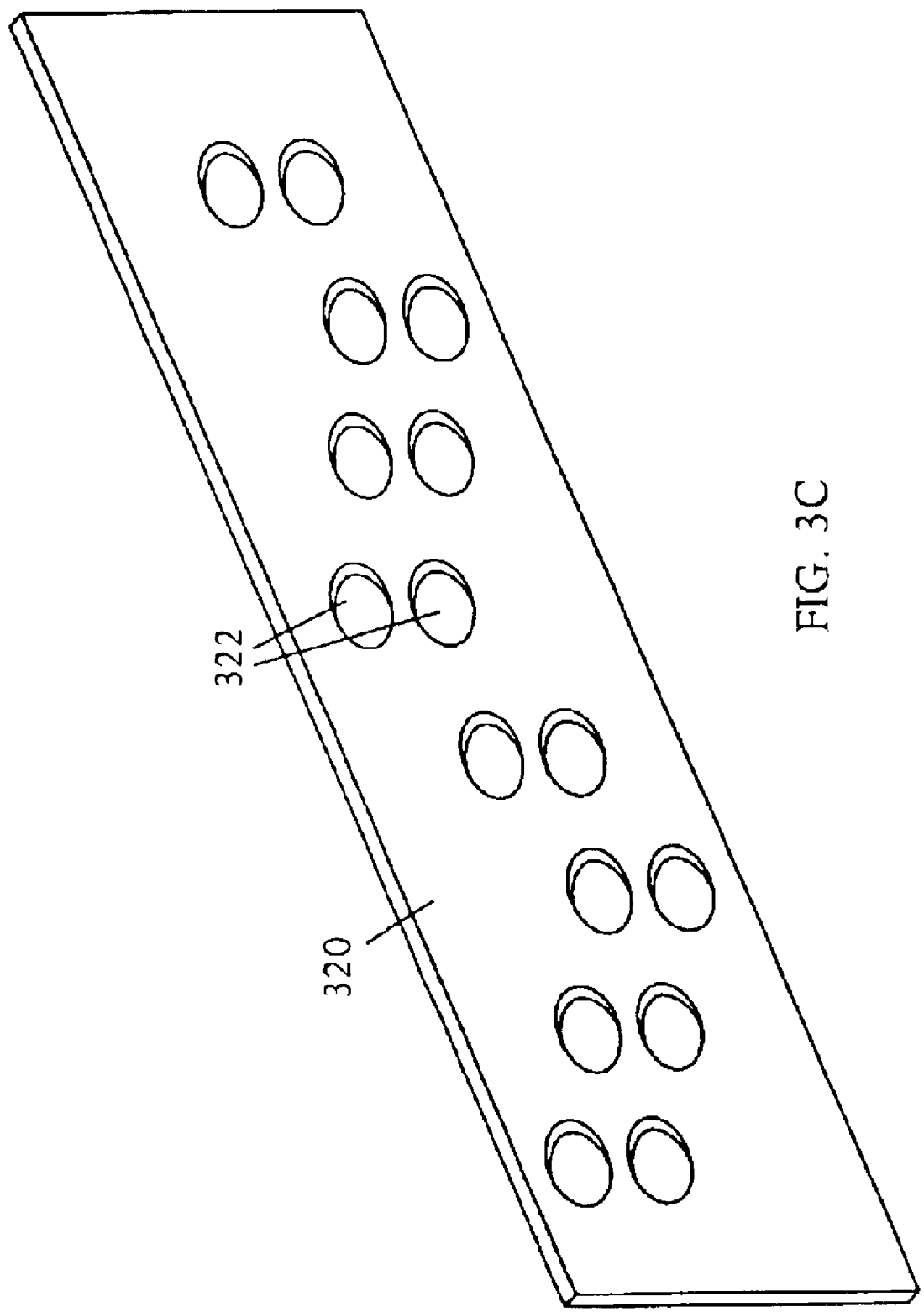
Figure 3D:
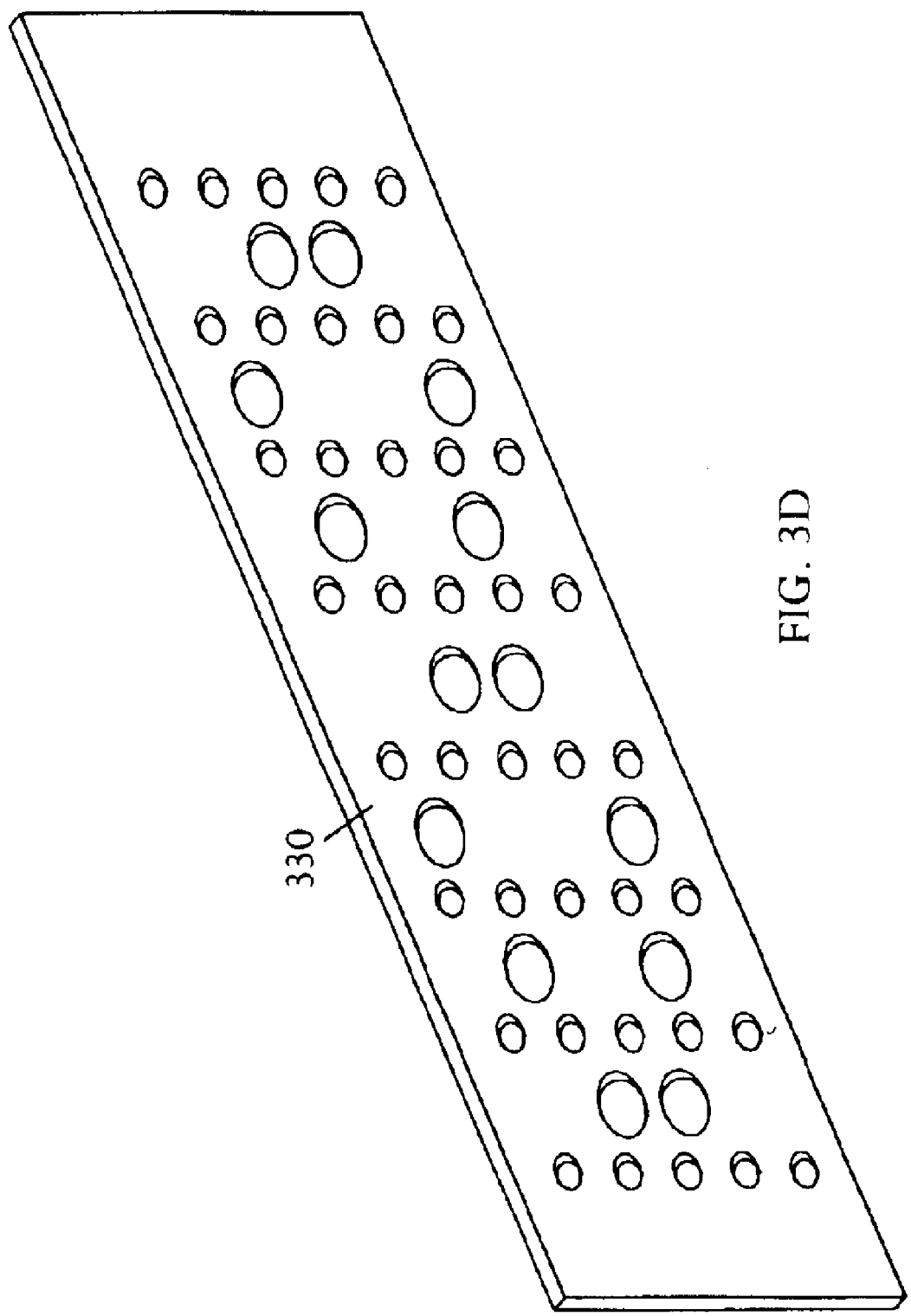

FIG. 3B shows an example of a divider 310 with a reduced number of equally-spaced apertures 312 in comparison to the divider 300 shown in FIG. 3A. FIG. 3C shows an example of a divider 320 with a smaller number of large apertures 322 formed in an oscillating or sinusoidal pattern along the longitudinal axis of the divider 320. FIG. 3D illustrates an example of a divider 330 with multiple-sized apertures. FIG. 3E shows an example of a divider 340 with apertures of multiple sizes and shapes arranged in a pattern along the longitudinal axis of the divider 340. In some embodiments, the apertures can be arranged in a configuration that directs airflow toward a selected location in the card cage, for example to a particular type of integrated circuit chip, such as a processor, on a card. Some integrated circuits, for example processors, may generate large quantities of heat so that additional airflow is desirable.

Figure 3F:
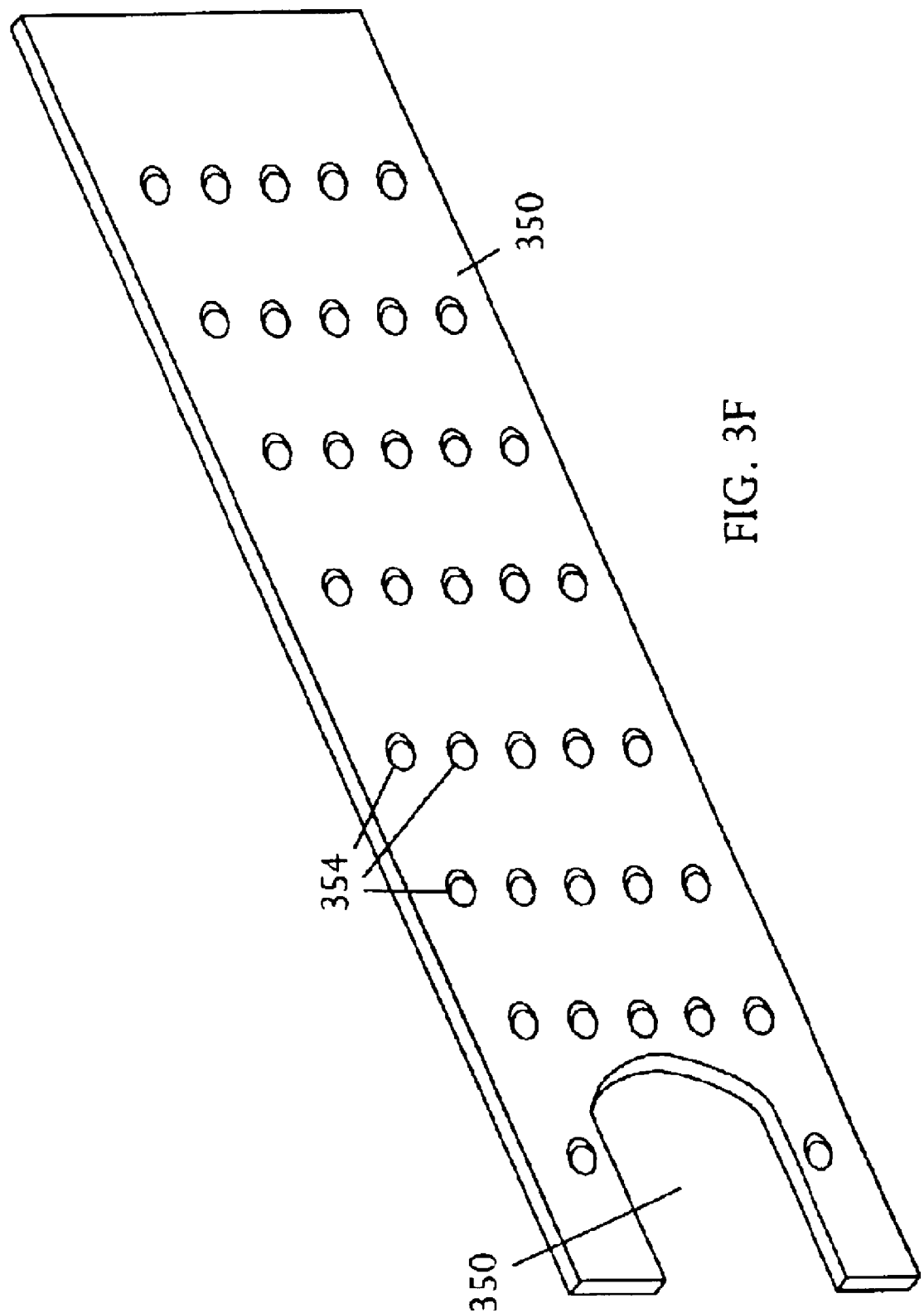

FIG. 3F depicts a divider 350 with a cut-out 352 at the edge of the divider card that is generally inserted into a card cage in close proximity to the cooling fans to create an effective plenum that enables airflow through multiple cards in the card cage. The divider 350 also includes a plurality of apertures 354 to further assist airflow through the card cage.

Referring to FIG. 4, a schematic pictorial diagram depicts an example of a divider 400 that includes a plurality of louvers 402 to manage airflow. The divider 400 has multiple openings 404 covered with moveable slats 406 for controlling the opening size. The louvers 402 are formed into a planar member of the divider 400 and use the movable slats 406 to control airflow through the planar member, for example to enlarge the openings in the vicinity of a card that generates a large amount of heat.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, the disclosed system and dividers have apertures, openings, holes, cut-outs, perforations, voids, and other structures with particular sizes, densities, patterns, arrangements, and configurations. These are simply examples of possible suitable and appropriate structures. Other embodiments may use openings of other sizes, densities, patterns, configurations, and arrangements as is suitable and appropriate for various applications. Furthermore, the illustrative system is described as a Peripheral Component Interconnect (PCI) system. The disclosed systems, apparati, and dividers may be used in systems according to other standards or in compliance with an open or nonstandard system. In addition, although the disclosed system is highly useful for hot-swappable and hot-pluggable systems, the usefulness also extends to other types of systems, or mixed systems.

What is claimed is:

1. A divider for separating integrated circuit cards in a card cage comprising:
    a planar member;
    at least one engagement edge disposed on the planar member and capable of engaging a slot in the card cage; and
    at least one aperture formed in and extending fully through the planar member and having an edge with a curved surface inclined at an angle to channel airflow through the aperture from a first side to a second opposing side of the planar member.

2. The divider according to claim 1 wherein:
    the planar member has a length selected from a group comprising: (1) a length that extends the fill length of the card cage; (2) a length greater than a maximum card length, and (3) a length shorter than a nominal card length.

3. The divider according to claim 1 further comprising:
    a louver formed into the planar member and having a movable slat for controlling airflow through the planar member.

4. The divider according to claim 1 further comprising:
    a plurality of apertures arranged in a configuration that directs airflow toward a selected location in the card cage.

5. The divider according to claim 1 further comprising:
    a plurality of apertures formed in and extending fully through the planar member, the apertures having multiple different sizes and arranged on the planar member to concentrate cooling at a selected location.

6. The divider according to claim 1 further comprising:
    a plurality of apertures formed in and extending in a sinusoidal pattern along the planar member.

7. An electronic system comprising:
    an enclosure;
    a card cage enclosed within the enclosure and having a plurality of slots capable of securing a corresponding plurality of circuit cards;
    a cooling fan coupled inside the enclosure adjacent the card cage and directing airflow toward the card cage to regulate temperature of the circuit cards; and
    at least one divider for separating the circuit cards in the card cage, the at least one divider further comprising:
        a planar member;
        at least one engagement edge disposed on the planar member and capable of engaging a slot in the card cage; and
        at least one aperture formed in and extending fully through the planar member and having an edge with a curved surface inclined at an angle to channel airflow through the aperture from a first side to a second opposing side of the planar member.

8. The electronic system according to claim 7 wherein:
    the enclosure is densely-packed with the card cage arranged in close proximity to the fan.

9. The electronic system according to claim 7 wherein:
    the system supports hot-pluggable circuit cards.

10. The electronic system according to claim 7 wherein:
    the planar member has a length selected from a group comprising: (1) a length that extends the full length of the card cage; (2) a length greater than a maximum length, and (3) a length shorter than a nominal card length.

11. The electronic system according to claim 7 further comprising:
    a louver formed into the planar member and having a movable slat for controlling card airflow through the planar member.

12. The electronic system according to claim 7 further comprising:
    a plurality of apertures arranged in a configuration that directs airflow toward a selected location in the card cage.

13. The electronic system according to claim 7 further comprising:
    a plurality of apertures formed in and extending fully through the planar member, the apertures having multiple different sizes and arranged on the planar member to concentrate cooling at a selected location.

14. An apparatus for separating integrated circuit cards in a card cage comprising:
    means for electrically and physically separating two integrated circuit cards;
    means disposed on the separating means for engaging a slot in the card cage;
    means formed in and extending fully through the separating means for facilitating airflow through the card cage; and
    means formed into the separating means for forming a plenum space in proximity to a cooling fan.

15. The apparatus according to claim 14 wherein:
    the separating means extends the full length of the card cage.

16. The apparatus according to claim 14 further comprising:
    means formed in and extending through the separating means, and having an edge with a curved surface that facilitates air flow from a first side to a second opposing side of the separating means.

17. The apparatus according to claim 14 further comprising:
    means for controlling airflow through the separating means.

18. The apparatus according to claim 14 further comprising:
    means for directing airflow toward a selected location in the card cage.

19. The divider for separating integrated circuit cards in a card cage comprising:
    a planar member;
    at least one engagement edge disposed on the planar member and capable of engaging a slot in the card cage; and at least one aperture formed in and extending fully through the planar member, the at least one aperture facilitates airflow through the card cage wherein:

a cut-out on an edge of the planar member that is configured for insertion into the card cage in proximity to a cooling fan, the cut-out forming a plenum space facilitating airflow through the card cage.

20. The electronic system comprising:

an enclosure;

a card cage enclosed within the enclosure and having a plurality of slots capable of securing a corresponding plurality of circuit cards;

a cooling fan coupled inside the enclosure adjacent the card cage and directing airflow toward the card cage to regulate temperature of the circuit cards; and at least one divider for separating the circuit cards in the card cage, the at least one divider further comprising:

a planar member;

at least one engagement edge disposed on the planar member and capable of engaging a slot in the card cage; and at least one aperture formed in and extending fully through the planar member, the at least one aperture facilitates airflow through the card cage, wherein:

a cut-out on an edge of the planar member that is configured for insertion into the card cage in proximity to a cooling fan, the cut-out forming a plenum space facilitating airflow through the card cage.

* * * * *